United States Patent [19]

Berchin

[11] Patent Number: 5,594,655
[45] Date of Patent: Jan. 14, 1997

[54] METHOD AND APPARATUS FOR FREQUENCY TRIGGERING IN DIGITAL OSCILLOSCOPES AND THE LIKE

[75] Inventor: Gregory J. Berchin, Glen Ellyn, Ill.

[73] Assignee: Nicolet Instrument Corporation, Madison, Wis.

[21] Appl. No.: 110,417

[22] Filed: Aug. 20, 1993

[51] Int. Cl.$^6$ .................................................. G01R 23/16
[52] U.S. Cl. .................... 364/487; 324/76.24; 324/76.61
[58] Field of Search ...................................... 364/487, 480, 364/484, 485, 483, 576, 579; 324/76.11, 76.12, 76.19, 76.21, 76.24, 76.38, 76.58, 76.61

[56] References Cited

U.S. PATENT DOCUMENTS

| | | |
|---|---|---|
| 3,544,775 | 12/1970 | Bergland et al. |
| 3,704,826 | 12/1972 | Constantin . |
| 3,778,606 | 12/1973 | Schmitt et al. |
| 3,803,391 | 4/1974 | Vernet . |
| 4,057,756 | 11/1977 | Ley et al. |
| 4,282,579 | 8/1981 | Speiser et al. |
| 4,319,329 | 3/1982 | Girgis et al. |
| 4,715,000 | 12/1987 | Premerlani . |
| 4,723,125 | 2/1988 | Elleaume . |
| 4,730,257 | 3/1988 | Szeto . |
| 4,772,889 | 9/1988 | Elleaume . |
| 4,802,098 | 1/1989 | Hansen et al. |
| 4,928,251 | 5/1990 | Marzalek et al. |
| 4,929,954 | 5/1990 | Elleaume . |
| 5,216,621 | 6/1993 | Dickens .................................... 364/483 |

OTHER PUBLICATIONS

J. W. Cooley, et al., "The Finite Fourier Transform," IEEE Trans. on Audio and Electroacoustics, vol. AU–17, No. 2, Jun. 1969, pp. 77–85.

P. C. Y. Yip, "Some Aspects of the Zoom Transform," IEEE Trans. on Computers, vol. C–25, No. 3, Mar. 1976, pp. 287–296.

G. Bongiovanni, et al., "Procedures for Computing the Discrete Fourier Transform on Staggered Blocks," IEEE Trans. on Acoustics, Speech, and Signal Processing, vol. ASSP–24, No. 2, Apr. 1976, pp. 132–137.

C. Tiefenthaler, "DSP Chip Runs Fourier Transforms on Non–stop Input," Electronic Products, Jun. 1, 1987, pp. 26–32.

T. Springer, "Sliding FFT Computes Frequency Spectra In Real Time," EDN, Sep. 29, 1988, pp. 161–170.

*Primary Examiner*—Ellis B. Ramirez
*Assistant Examiner*—Edward Pipala
*Attorney, Agent, or Firm*—Foley & Lardner

[57] ABSTRACT

A data acquisition system includes an analog to digital converter, a computer processor and a waveform memory in which is stored digital data from the A to D converter corresponding to an input signal. The processor provides a trigger responsive to a characteristic of a frequency component or components of the input signal to cause the memory to save the waveform data in the memory. The frequency characteristic may be determined, for example, by carrying out a synchronized recursive discrete Fourier transform which is updated for the selected frequency component or components with each new sample from the A to D converter.

38 Claims, 10 Drawing Sheets

→ TO OTHER STAGES IDENTICAL TO ABOVE EXCEPT FOR VALUE OF FREQUENCY INDEX "k"

METHOD AND APPARATUS FOR FREQUENCY TRIGGERING IN DIGITAL OSCILLOSCOPES AND THE LIKE

FIELD OF THE INVENTION

The present invention is generally directed to a method and apparatus for providing a trigger for a data acquisition system such as a digital oscilloscope and more particularly to a method and apparatus for providing a trigger based on a characteristic of one or more frequency components.

BACKGROUND OF THE INVENTION

It is often desirable to analyze various aspects of the waveform of a signal. For example, a waveform is often characterized or described by determining and displaying its amplitude as a function of time using an oscilloscope or other data acquisition device. A waveform may also characterized in the frequency domain, i.e. a characteristic (magnitude, phase, etc.) of one or more of its frequency components.

One way of determining the magnitudes of the frequency components of an input time domain signal is using a fast Fourier transform (FFT). The theory of the FFT, as well as algorithms with which one may perform an FFT, also called a discrete Fourier Transform (DFT), are well known. A description of the FFT is given in Cooley, et al., "The Finite Fourier Transform", IEEE Trans. On Audio Elec., June 1969. Another type of transform is the DHT (discrete Hartley transform), and is described in, for example, O'Neill, "Faster Than Fast Fourier", Byte, April 1988, pp 293–300.

For both time domain and frequency domain analysis, a data acquisition system may be used to collect data regarding the waveform, and either analyze or display the waveform. A digital data acquisition system such as a digital oscilloscope receives and digitizes a continuous analog input. The digitized data, in the form of magnitude data as a function of time, is stored in a memory. The memory commonly is circular; that is, the memory is continuously re-written with the newest sample datum replacing the oldest sample datum until a trigger event occurs, at which point rewriting of the memory is stopped such that the data either before or after the trigger event (or some of both) is saved in the memory for analysis.

Trigger events have typically been based on the time domain input signal. For example, a trigger event may be the time domain input signal rising above a given magnitude. Another trigger event could be the slope of the time domain exceeding a given level. There have been numerous types of trigger events used, but they generally are responsive to a time domain characteristic of the signal.

Frequency domain triggering has not been generally used because it requires that a DFT, which is computationally difficult, be performed on the incoming data before the relevant signal data in the memory is written over. According to known methods of determining a DFT the digitizing rate must be limited to a few tens of kilohertz (kHz) to allow sufficient time to calculate a DFT before new data is written into the memory to replace the data on which the DFT calculation was based. This limitation, of course, limits the allowable frequency content of the signal being analyzed. The known methods of determining a DFT in a useful time frame also require that the number of points be limited, thereby limiting the spacing of the frequency bins of interest. In addition, while often only a few frequency bins are of interest, computing a DFT according to the prior art generally results in data for all frequency bins, requiring the time consuming performance of needless calculations.

One prior method of calculating a DFT, known as the Sliding DFT (SDFT), is described in Springer, "Sliding FFT Computes Frequency Spectra In Real Time", EDN, Sep. 29, 1988. Equation 1 below shows the SDFT formula from the article by Springer, using somewhat different nomenclature:

$$X(k,l) = e^{\frac{j2\pi k}{N}} * [X(k, l-1) + x(l+N-1) - x(l-1)] \qquad (1)$$

where k is the frequency bin index, N is the number of points in the DFT, x(n) is the magnitude of the time domain datum at the sample "n" where n is the time domain index, and X(k,l) is the complex amplitude in frequency bin k (the DFT for frequency k at time index l). The SDFT calculates a DFT for N points, from l to l+N–1, by updating the previous DFT (for the N points from l–1 to l+N–2). The updating is accomplished by subtracting the time domain magnitude of the first point in the previous DFT, x(l–1), and adding the amplitude of the latest time domain point, x(l+N–1). The sum is then multiplied by a phase shifting factor, $e^{j2\pi k/N}$. For the purposes of calculating the SDFT, the time reference point (t=0) is the first point in each DFT update. In other words, the zero time point is changed with each SDFT update. The calculations needed to obtain the updated DFT for each frequency bin k are two real adds and a complex multiply, or four real multiplies and four real adds, because the exponent and X(k,l–1) are complex and x(l+N–1) and x(l–1) are real. While this operation is much faster than calculating the DFT from scratch, it is still not fast enough for most frequency triggering operations.

SUMMARY OF THE INVENTION

A digital data acquisition system in accordance with the present invention is capable of triggering based on the characteristics of a selected frequency component or components in the input signal. To trigger based on frequency components, the digital data acquisition system calculates the frequency components at a rate which allows frequency triggering on signals which have relatively high frequency components as the waveform is being recorded. It does so in a manner which determines the discrete transform of an arbitrary length signal in which the frequency bins of interest are updated in real time, and the frequency bins which are not of interest are not updated. A trigger signal is then provided when a selected criterion is met, for example, when the amplitude(s) of the selected frequency bin or bins of interest cross the threshold(s).

A data acquisition device according to the invention includes an analog to digital converter having an input and an output, a computer processor, and a memory device to hold data corresponding to the acquired waveform. The memory may be circular, such that new waveform data is continuously written over old data until a trigger event occurs. The processor has an output and a data input, the data input being coupled to the output of the analog to digital converter which receives an input time domain signal. The processor provides a trigger, responsive to a characteristic of a frequency component of the signal, to the memory device to save the waveform data currently in the memory.

The present invention also encompasses a method of providing a trigger for a data acquisition system having a waveform memory, which includes the steps of acquiring an input waveform and determining selected frequency components of the input waveform utilizing a discrete transform such as a synchronized recursive discrete Fourier transform (SRDFT), and updating the selected frequency component(s) as a new data sample is acquired. The selected updated frequency component is evaluated and a trigger is provided to save the data in the memory when a selected criterion for the frequency component or components is met.

Further objects, features and advantages of the invention will be apparent from the following detailed description when taken in conjunction with the accompanying drawings.

DETAILED DESCRIPTION OF THE INVENTION

The present invention is directed to a method and apparatus for providing a trigger for digital data acquisition based on a characteristic of one or more frequency components of the input signal. Specifically, the apparatus and method of the present invention provide a trigger based on a characteristic, such as magnitude, phase, slope or average value, of one or more frequency components of the input time domain signal. One way in which the characteristics of the frequency components may be provided is to perform a synchronous recursive DFT on the time domain data, which can be done in "real time" on signals having relatively high frequency components.

Figure 1:
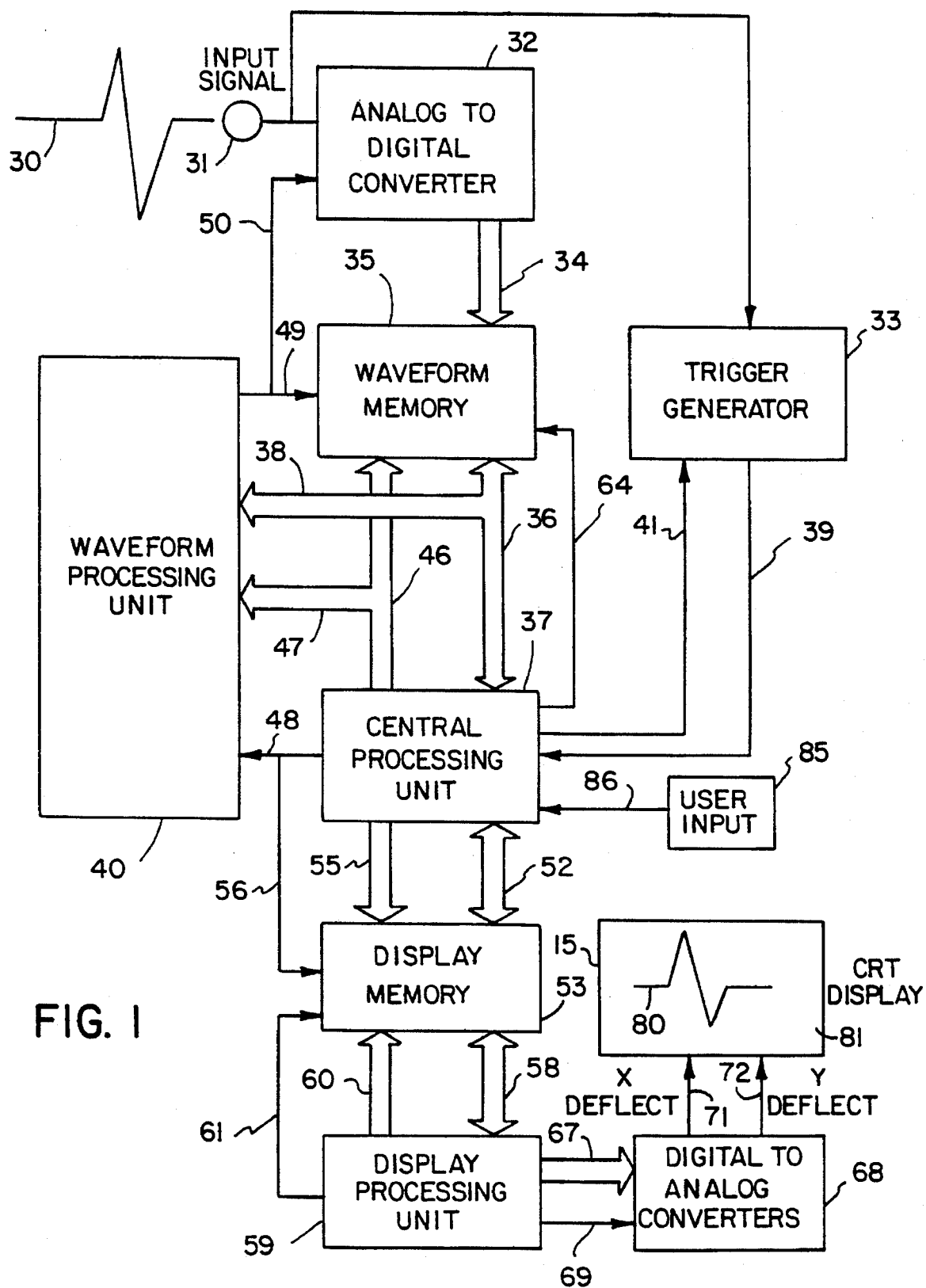
FIG. 1 is a block diagram of an exemplary data acquisition system in accordance with the present invention.

To illustrate the invention, a simplified block diagram of a digital oscilloscope apparatus which carries out the present invention is shown in FIG. 1. An analog input signal 30, which may be a time varying voltage, is received at an input terminal 31 which may include input conditioning circuitry, and the conditioned analog signal is provided to an analog-to-digital converter (ADC) 32. The converter 32 provides multi-bit digital data on a data bus 34 to a waveform memory 35 where the data is assigned and written sequentially to memory positions over the period of time during which the input signal is sampled and acquired. Conventional analog trigger generator circuitry 33 may be connected to receive the signal from the input terminal 31 for triggering on the input signal 30 to save the waveform data in the waveform memory 35, and may be of conventional design well known in the art. The memory 35 may be a circular memory in which new data replaces old data in a continuous cycle as the memory is cycled through its addresses. The trigger signal from the trigger generator circuitry 33 is provided to the CPU 37 by a line 39 and the trigger generator 33 receives control signals from the CPU on lines 41. A trigger signal from the generator 33 may be used to cause the writing of new data in the memory 35 to be stopped and the existing data held in the memory. As described further below, the present invention allows triggering to occur based on frequency domain information as determined by the CPU 37 rather than from the conventional trigger generator 33.

The waveform memory 35 is in communication via data bus lines 36 to the central processing unit 37 and via data bus lines 38 to a waveform processing unit 40. The waveform processing unit 40 is of conventional technology capable of recording and recalling data collections. Its responsibilities include the writing of collected data points into the waveform memory 35 and remembering where the first point in the collection was written. This information is read by the central processing unit 37 and used to generate the display shown on the screen 81 of a cathode ray tube (CRT) display unit 15. The central processing unit (CPU) controller 37 (e.g., a Motorola 68010 running with a 10 MHz clock) controls the writing of data into the waveform memory 35 and the reading of data from the memory via address bus lines 46, and the transfer of data to the waveform processing unit via an extension of the address bus lines 47. The control of the waveform processing unit 40 is also provided from the central processing unit by signals on control lines 48, with control lines 49 and 50 extending from the waveform processing unit to the waveform memory 35 and the analog-to-digital converter 32.

Data from the CPU 37 is provided on data bus lines 52 to a display memory 53, with the writing of data into and reading of data out of the display memory being controlled from the central processing unit via address bus lines 55 and control lines 56. Output data read from the display memory 53 is provided on data bus lines 58 to a display processing unit 59 which controls the reading of this data via an address bus 60 and control lines 61. The CPU 37 also provides control signals to the waveform memory 35 via control lines 64. The display may be generated in a conventional fashion, such as by vectored deflection, although a raster scanned display may also be used if desired.

The data from the display processing unit 59 is provided in digital form on a data bus 67 to a digital-to-analog converter 68 which is also controlled by the display processing unit 59 by signals passed over control lines 69. The digital-to-analog converter 68 provides an X deflection signal on a line 71 and a Y deflection signal on a line 72 to the cathode ray tube display unit 15 which includes conventional vertical and horizontal amplifiers and a cathode ray tube which generates a visual display on the CRT screen 81 of the waveform 80 (corresponding to data sampled from the analog input signal 30). Commands from the user are provided through a user input interface 85 which provides control signals on control lines 86 to the CPU 37.

All of the elements of the digital oscilloscope apparatus described above with respect to FIG. 1 are conventional and well known in the art and are described as shown to illustrate the invention, although it is understood that other arrangements for computer controlled data acquisition systems may also be utilized in the present invention.

The data stored in the circular waveform memory 35 is also analyzed by the CPU processor 37, in accordance with a set of instructions which may be stored in its internal read-only memory (not shown), to obtain a frequency spectrum for the frequency components (frequency bins) of interest. When the frequency bins of interest exhibit a predetermined characteristic (magnitude greater or less than a given level, for example) the CPU processor 37 sends a trigger to the circular waveform memory 35 on the control line 36, causing the memory 35 to save the data of interest. The data of interest may be either before, after, or on both sides of the trigger event. Where triggering occurs based on frequency characteristics, the "trigger event" may not correspond to any particular feature of the time domain waveform of the input signal. Rather, the "event" is the time at which the latest sample causes the calculated frequency characteristic to meet the selected criterion for triggering.

The waveform saved in the memory may then be displayed on the display device 15. In typical digital oscilloscope applications, the display is periodically updated, commonly when a new trigger event occurs, so that the waveform displayed on the display screen is a waveform recently received by the digital oscilloscope. With reference to the digital oscilloscope apparatus of FIG. 1, updating can be accomplished by moving the saved waveform data from the waveform memory 35 to the display memory 53 (from which the data is displayed on the display device 15) and then restarting the writing of new waveform data into the waveform memory 35 as described above. Of course, other structures may be used to implement this invention. For example, the analog to digital converter 32 could be internal to the CPU processor 37. The acquired data may also be saved for later analysis, as on magnetic media or other long term memory, rather than being displayed in real time.

In an exemplary implementation of the invention, the processor 37 determines the frequency spectrum of the input waveform using a synchronized recursive DFT (SRDFT). An SRDFT is similar to a SDFT, except that the time reference (t=0) is not changed as it is in the SDFT. The formula for determining the updated DFT using an SRDFT is given in Equation 2 below:

$$X(k, l) = X(k, l-1) + e^{\frac{-j2\pi k(l-1)}{N}} * [x(l+N-1) - x(l-1)] \quad (2)$$

where, as with Equation 1, k is the frequency bin index, N is the number of points in the DFT, x(n) is the magnitude of the time domain datum at sample "n" where n is the time domain index, and X(k,l) is the complex amplitude in frequency bin k (the DFT for frequency k at the index l). Because the SRDFT uses a fixed time reference, the X(k,l−1) term is not multiplied by the exponential, and only two real multiplies and three real adds are needed to complete the calculation. The derivation of Equation 2 is given below. The definition of a DFT for an N point sequence, beginning at point zero (n=0) is:

$$X(k) = \sum_{n=0}^{n=N-1} x(n) * e^{\frac{-j2\pi kn}{N}} \quad (3)$$

From Equation 3 we can shift the initial point from zero to l, to get:

$$X(k, l) = \sum_{n=0}^{n=N-1} x(n+l) * e^{\frac{-j2\pi k(n+l)}{N}} \quad (4)$$

The foregoing assumes that the input data is a continuous stream of data (otherwise x(n+l) may not exist). Equivalently:

$$X(k, l) = \sum_{n=0}^{n=N-1} x(n+l) * e^{\frac{-j2\pi k(n+l)}{N}} + \quad (5)$$

$$x(l-1) * e^{\frac{-j2\pi k(l-1)}{N}} - x(l-1) * e^{\frac{-j2\pi k(l-1)}{N}}$$

and combining the first two terms yields:

$$X(k, l) = \sum_{n=-1}^{n=N-1} x(n+l) * e^{\frac{-j2\pi k(n+l)}{N}} - x(l-1) * e^{\frac{-j2\pi k(l-1)}{N}} \quad (6)$$

If m=n+1, then $$X(k, l) = \sum_{m=0}^{m=N} x(m+l-1) * e^{\frac{-j2\pi k(m+l-1)}{N}} - x(l-1) e^{\frac{-2j\pi k(l-1)}{N}} \quad (7)$$

and $$X(k, l) = \sum_{m=0}^{m=N-1} x(m+l-1) * e^{\frac{-j2\pi k(m+l-1)}{N}} - \quad (8)$$

$$x(l-1) e^{\frac{-2j\pi k(l-1)}{N}} + x(N+l-1) * e^{\frac{-j2\pi k(N+l-1)}{N}}$$

to give:

$$X(k, l) = \sum_{m=0}^{m=N-1} x(m+l-1) * e^{\frac{-j2\pi k(m+l-1)}{N}} + \quad (9)$$

$$e^{\frac{-2j\pi k(l-1)}{N}} [x(N+l-1) - x(l-1)]$$

As may be seen from Equations 2 and 9, the SRDFT calculates a DFT for N points, from l to l+N−1, by updating the previous DFT (for the N points from l−1 to l+N−2). The updating is accomplished by taking the difference of the amplitude of the time domain sample being added to the previous sequence, x(l+N−1), and the amplitude of the time domain sample being deleted from the previous sequence. The difference is multiplied by a phase shifting factor, $e^{-j2\pi k(l-1)/N}$ and added to the DFT of the previous sequence (from l−1 to l−1+N−1). The time reference (t=0) is not changed with each SRDFT update, thereby reducing the number of adds and multiplies.

When more than one frequency bin is being monitored (different values for k) an update for the sum of the bins is readily obtained. By summing the previous DFT values for the two bins, an update may be obtained by multiplying the result of the subtraction x(l+N−1)−x(l−1) by the sum of the exponential multiplier due to each bin. If the sum of the exponential multipliers is stored in a lookup table, the computational burden for multiple bin updates is no greater than that for updating a single frequency bin.

It should be noted that the phase shift term in the SDFT (the exponential) is a constant, while, in the SRDFT, the phase shift is dependent on l. This means that a trigonometric look-up table can be used to complete the SRDFT, and that the SRDFT will be faster than the SDFT when two memory fetches are performed faster than the extra multiplies and adds needed in the SDFT, as is usually the case. Also, because the exponential terms of the SRDFT will have errors, and the updating results in the errors accumulating, the sum of the error in the lookup table should be zero and the errors should be evenly distributed.

It is possible to use synchronous sliding transforms other than a DFT. For example, an SRDHT (synchronized recursive discrete Hartley transform) may be similarly derived to yield:

$$H(h, l) = H(k, l-1) + \frac{1}{N} * [h(l+N-1) - h(l-1)] * \cos\left(\frac{2\pi k(l-1)}{N}\right) \quad (10)$$

It should be understood that all statements regarding DFTs are generally applicable to the SRDHT, or other transforms such as the chirp-Z transform. As one skilled in the art should recognize, however, two DHT bins must be computed to determine the spectral amplitude, but the length of time to compute both bins should not be significantly greater than the time required to compute a single DFT bin.

Figure 2:
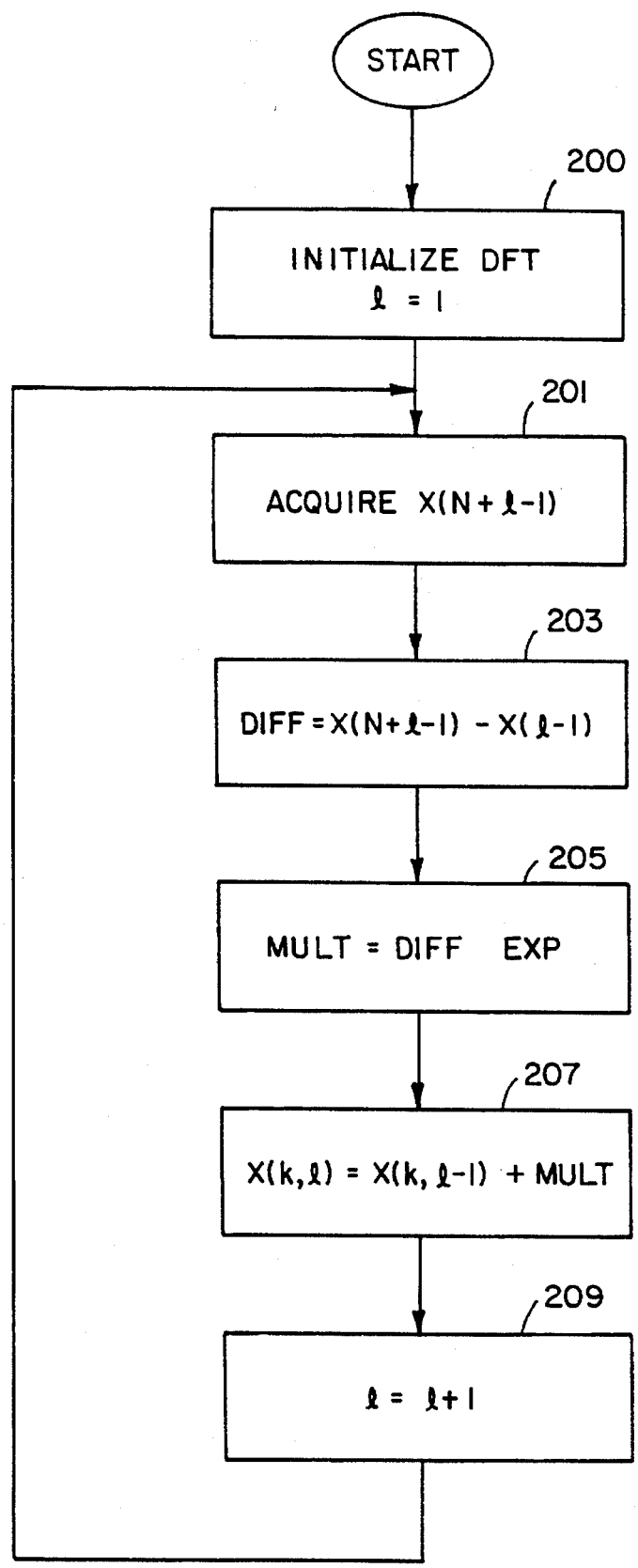
FIG. 2 is a flow chart showing the steps for determining a synchronized recursive DFT (SRDFT) in accordance with the invention.

Referring now to FIG. 2, a flow chart showing the steps that the processor 37 carries out to determine the SRDFT includes an initialization step 200, an acquisition step 201, a subtraction step 203, a multiplication step 205, an addition step 207, and an increment step 209.

In particular, in step 200 the processor 37 initializes the DFT by calculating it for the first N points. The initial DFT may be calculated in a conventional manner, such as that shown in the above-referenced article by Cooley. The processor 37 also sets the index 1 equal to one in step 200.

After initializing the DFT, the processor 37 acquires the next time domain value, x(N+l−1) at step 201. In step 203 the processor 37 finds the difference in the magnitudes of the N+l−1 and the l−1 time domain points, and in step 205 the processor 37 multiplies the difference by the exponential set forth in Equation 2 above. In step 207, the product from step 205 is added to the previously determined DFT, to obtain a new DFT. Finally, in step 209, the processor 37 increments the index l, and returns to step 201 to acquire the next time domain point.

Figure 4:
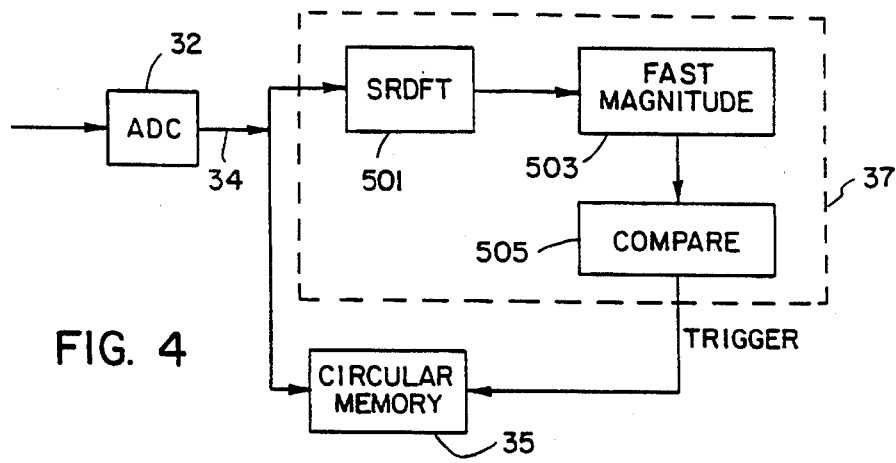
FIG. 4 is a block diagram illustrating the computational flow in the processor of FIG. 1 when carrying out the invention.

Referring now to FIG. 4, a block diagram is shown of the suboperations of the processor 37 carried out to determine a trigger. These suboperations include an SRDFT unit 501, a FAST MAGNITUDE unit 503, and a COMPARE unit 505. These suboperations generally will be performed within the processor 37 in accordance with its programming, but separate hardware units could be utilized if desired. The ADC 32 provides the digitized signal (either directly or through the memory 35) to the SRDFT unit 501 of the processor 37 and also to the memory 35. The SRDFT unit 501 performs an SRDFT on the incoming data, and provides the output to the FAST MAGNITUDE unit 503. The FAST MAGNITUDE unit 503 determines the magnitude of the frequency bin of interest and provides that magnitude to the COMPARE unit 505. The COMPARE unit 505 compares the magnitude of the frequency bin of interest to a trigger level and, if an appropriate condition is found (e.g., the frequency level is above or below a selected trigger level), provides a trigger on the line 64 to the memory 35 if a trigger event occurs. Additional FAST MAGNITUDE units and COMPARE units can be incorporated to enable triggering on more than one frequency bin.

Figure 3:
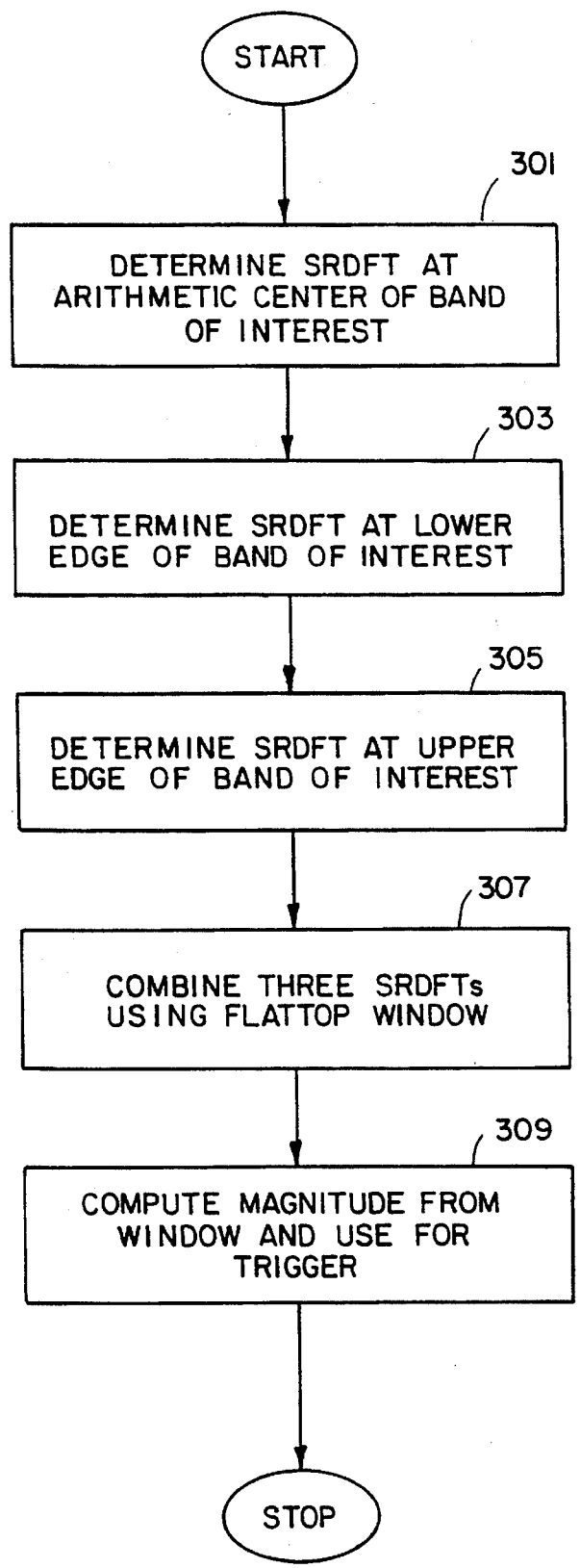
FIG. 3 is a flow chart showing the steps for monitoring a band of frequencies in accordance with the invention.

The above apparatus and method will compute the DFT in any given frequency bin. However, it may also be desirable to trigger from a band of frequencies. FIG. 3 shows a flowchart of the steps that can be performed by the processor 37 to monitor a band of frequencies for a trigger event. At step 301 the SRDFT for the frequency bin at the arithmetic center of the band of interest is determined, and in steps 303 and 305 the SRDFTs for the frequency bins at the edges of the band of interest are determined. Thus, these frequency bins span the band of frequencies of interest. Then, using a flattop window, which will be described in detail below with reference to FIG. 4, the three bins are combined in step 307. The magnitude in the complex number resulting from the windowing operation is an estimate of the magnitude of the band of interest, and this estimate is compared to a selected trigger threshold at step 309. This routine has been described in conjunction with an SRDFT, but will work equally well with an SDFT, a DFT, a DHT or other transform, so long as the computational power to calculate the amplitude in the three frequency bins exists. Also, the above techniques can be used to monitor signals outside of a frequency band, by examining all frequency bins outside of the band.

The routine described above will work only when the three frequency bins chosen (the center and ends) fall exactly on DFT bins with no other bins in between. In other words they must be consecutive harmonics of a fundamental frequency. If the center and endpoints are not consecutive harmonics, the frequency band must be divided into subbands which meet that requirement. The procedure for doing so will be described in detail later. Also, the number of points, N, used in the DFTs must be the lowest common multiple of the center and end frequencies.

A flattop window which may be used to create the frequency band consists of three shifted and scaled Dirichlet kernels. The three kernels are centered at −1, 0 and +1, respectively. Their magnitudes are summed to obtain the flattop window. The expression for the window function Y(k) is given below:

$$y(k) = \frac{1 - \cos(2\pi k) + j\sin(2\pi k)}{1 - \cos\left(\frac{2\pi k}{N}\right) + j\sin\left(\frac{2\pi k}{N}\right)} + \\ A\left(\frac{1 - \cos[2\pi k(k+1)] + j\sin[2\pi(k+1)]}{1 - \cos\left[\frac{2\pi(k+1)}{N}\right] + j\sin\left[\frac{2\pi(k+1)}{N}\right]}\right) + \\ A\left(\frac{1 - \cos[2\pi k(k-1)] + j\sin[2\pi(k-1)]}{1 - \cos\left[\frac{2\pi(k-1)}{N}\right] + j\sin\left[\frac{2\pi(k-1)}{N}\right]}\right) \quad (11)$$

where k is a continuous variable and A is a constant.

Switching the order of the first and second terms, the output of the flattop window may be written as Y(k)=A * F(k−1)+F(k)+A * F(k+1), where k is now a discrete variable and F(k) is dependent on the output from the SRDFT or DFT for frequency bin k. Y(k) determined in this manner is then used to determine if a trigger should be provided. A preferred value of A is −0.848826.

When using the above technique to combine SRDFT (or DFT) multiple frequency bins, the frequency bins must have the same sampling rate and number of samples, as well as be referenced to the same starting point (t=0). This will insure that their phase is referenced to the same point and that their bin spacing is identical. The sampling rate should be at least twice the highest frequency of interest, to meet the Nyquist criterion, and when only one frequency bin is monitored the sampling rate is preferably an integer multiple of the bin frequency, wherein the integer is three or greater. If several frequency bins are being combined, the sampling frequency must be a common multiple of the frequencies of the different bins.

As stated earlier, the flattop window requires that the center and end points of the frequency band of interest be consecutive harmonics. If that is not the case, the flattop window may be used only if the frequency band is subdivided into frequency bands that are consecutive harmonics. For example, suppose that a frequency band from 40 Hz to 70 Hz is to be examined for a trigger event. The band is divided into 2 sub-bands, one from 40–50 Hz, and the other from 50–70 Hz. Each sub-band now meets the consecutive harmonics criteria: 40 Hz, 45 Hz, and 50 Hz are consecutive harmonics of 5 Hz, and 50 Hz, 60 Hz, and 70 Hz are consecutive harmonics of 10 Hz. The outputs of the two sub-bands are monitored, and a trigger is provided if a trigger event in at least one of the sub-bands occurs. In some cases it may be necessary to divide the frequency band into more than two sub-bands.

Any of the above techniques may be used with SRDFT, SDFT, DFT, SRDHT, or DHT to obtain frequency bin magnitudes. The main requirement is that the bin magnitude be determined before the circular memory is rewritten. Also, a window other than a flattop may be used. For example, the Hamming or Von Hann windows will also provide an output magnitude for a band of frequencies.

A sliding Chirp-Z transform may also be utilized in the present invention. The Chirp-Z transform (CZT) may be thought of as a generalization of the discrete Fourier transform. Whereas the DFT computes values at points equally spaced around the unit circle starting at an angle of zero, the CZT computes values at points equally spaced around spiral contours, starting at any arbitrary angle. If the initial angle, angle increment, and spiral contour are chosen appropriately, then the CZT becomes the DFT.

The following describes a recursive CZT algorithm which may be used in a manner similar to the SDFT:

$$X(k)_l = \sum_{n=1}^{n=0} x(n+l)A^{-n} W^{nk} \quad (12)$$

where $A=A_0 e^{j\theta_0}$, $W=W_0 e^{-j\phi_0}$, and:

k is the CZT bin being computed
l is the time index at which the CZT is being computed
n is a time index
N is the total number of points in the CZT
x(l) is the input sample at time "l"
$A_0$ and $\theta_0$ are the location of the first CZT bin
$W_0$ is the initial spiral radius
$\phi_0$ is the angle increment Note that, if $A_0=1$, $\theta_0=0$, $W_0=1$, and $\phi_0=2\pi/N$, the CZT becomes the DFT.

The CZT at the next point, (l+1), is:
Let p=n+1; n=p-1:

$$X(k)_{l+1} = \sum_{n=0}^{N-1} x(n+l+1)A^{-n} W^{nk} \quad (13)$$

$$X(k)_{l+1} = \sum_{p=1}^{N} x(p+l)A^{-(p-1)} W^{(p-1)k} \quad (14)$$

$$= \sum_{p=1}^{N} x(p+l)A^{-p} A W^{pk} W^{-k} \quad (15)$$

$$= \sum_{p=1}^{N} x(p+l)A^{-p} W^{pk} A W^{-k} \quad (16)$$

$$= AW^{-k} \left[ \sum_{p=0}^{N} x(p+l)A^{-p} W^{pk} \right] \quad (17)$$

and, finally:

$$X(k)_{l+1} = AW^{-k} \left[ \sum_{P=0}^{N} x(p+l)A^{-p} W^{pk} - x(l) + x(N+l)A^{-N}W^{NK} \right] \quad (18)$$

The procedure is particularly useful for triggering because points may be placed anywhere on or off the unit circle instead of only at discrete points.

The discrete Fourier transform (DFT), discrete Hartley transform (DHT) and chirp-z transform (CZT) are all special cases of a more general transform. In general, therefore, special processing which is applicable to one is often applicable to the others as well. The derivation is as follows:

$$X(k) = \sum_{n=0}^{N-1} x(n)A^{-n}W^{nk} \text{ (definition of } CZT) \quad (19)$$

$$A = A_0 e^{j\theta_0}, w = w_0 e^{-2\phi}$$

Then:

$$X(k) = \sum_{n=0}^{N-1} x(n)A^{-n} W_c e^{-jk\phi_0 n} \quad (20)$$

$$= \sum_{n=2}^{N-1} x(n)A^{-n} W_0[\cos(kn\phi_0) - j\sin(kn\phi_0)] \quad (21)$$

$$= \sum_{n=0}^{N-1} x(n)A^{-n}[W_c\cos(kn\phi_0) + W_s\sin(km\phi_0)] \quad (22)$$

where $W_c\cos(kn\phi_0)+W_s\sin(kn\phi_0)=W_0[\cos(km\phi_0)-j\sin(km\phi_0)]$.

Then:

$$X(k) = \sum_{n=0}^{N-1} x(n)A_0 e^{jn\phi_0}[W_c\cos(kn\phi_0) + W_s\sin(kn\phi_0)] \quad (23)$$

$$= A_0 \sum_{n=0}^{N-1} x(n)e^{jn\phi_0}[W_c\cos(kn\phi_0) + W_s\sin(kn\phi_0)] \quad (24)$$

If the requirement that $W_0 \cos(km\phi_0)+W_0[\cos(km\phi_0)-2\sin(km\phi_0)]$ is now removed, then the general form of the transform emerges.

Specifically,

If: $A_0=1$, $\phi_0=0$, $W_c=-jW_s=1$, $\phi_0=2\pi/N$, then the DFT is obtained.

If: $A_0=1$, $\phi_0=0$, $W_0=W_c=W_s=1$, $\phi_0=2\pi/N$, then the DHT is obtained.

If: $W_c=-jW_s$, then the CZT is obtained.

As used herein, the term "discrete transform" includes any such transform that may be used to obtain information on the frequency components of a signal.

Figure 5:
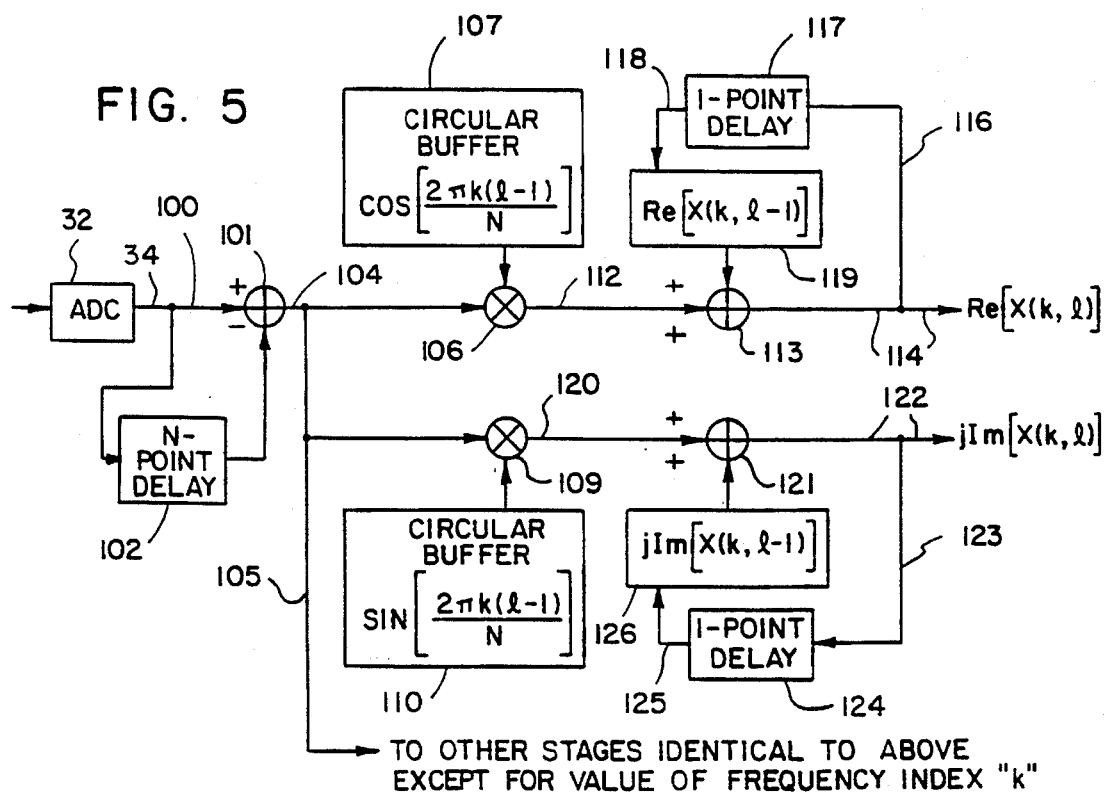
FIG. 5 is a block diagram illustrating the computation of the SRDFT.

Block diagrams illustrating the computational flow in carrying out computation of the SRDFT and in making the comparison to determine a trigger signal in accordance with the present invention are shown in FIGS. 5–10. As explained above, this computational flow takes place within the central processor 37, although dedicated hardware units may be utilized if desired. With reference to FIG. 5, which shows the computation of the SSDFT for a selected frequency component, the input data from the analog-to-digital converter 32 is provided on the lines 34 which may feed directly to the CPU 37. This digital input signal consists of the latest sample x(l+N−1). For purposes of illustration, within the processor 37 this datum is provided on a flow path 100 directly to a summing junction 101. The datum is also provided through an N point delay unit 102 and the output of the delay 102 is subtracted at the junction 101. The output of the junction 101 on a path 104 may be provided on a path 105 to other SRDFT stages which are identical to the stage described in FIG. 5 except for the value of the frequency index k. The datum on the path 104 is also provided to a multiplying junction 106 which receives data from a circular buffer 107 in accordance with $$\cos 2\pi k \left( \frac{l-1}{N} \right).$$

Similarly, the datum on the path 104 is provided to another multiplying junction 109 which receives data from a circular buffer 110 in accordance with $$\sin 2\pi k \left( \frac{l-1}{N} \right).$$

The sinusoidal function from the buffers 107 and 110 are provided from a look-up table programmed into an internal ROM in the processor 37 to provide the exponential function of Equation 2 in accordance with the identity:

$$e^{-j2\pi k(l-1)/N} = \cos(2\pi k (l-1)/N) - j\sin(2\pi k (l-1)/N).$$

The output of the multiplying junction 106 is provided on a path 112 to a summing junction 113. The output of the summing junction 113 on a path 114 is the real part of the computed X(k,l). This output is also provided on a path 116 to a one point delay 117, the output of which on a path 118 is provided to a buffer 119 which holds the datum comprising the real part of X(k,l–1). This value is added at the summing junction 113 to provide the datum on the line 114.

Similarly, the output of the multiplying junction 109 is provided on a path 120 to a summing junction 121, and the output of the summing junction on the line 122 comprises the imaginary part of X(k, l). The datum in the path 122 is provided on a path 123 to a one point delay 124, the output of which on a line 125 is provided to a buffer 126 which holds the imaginary part of X(k,l –1). This value is added at the summing junction 121 to the datum on the line 120 to provide the output on the line 122.

Figure 6:
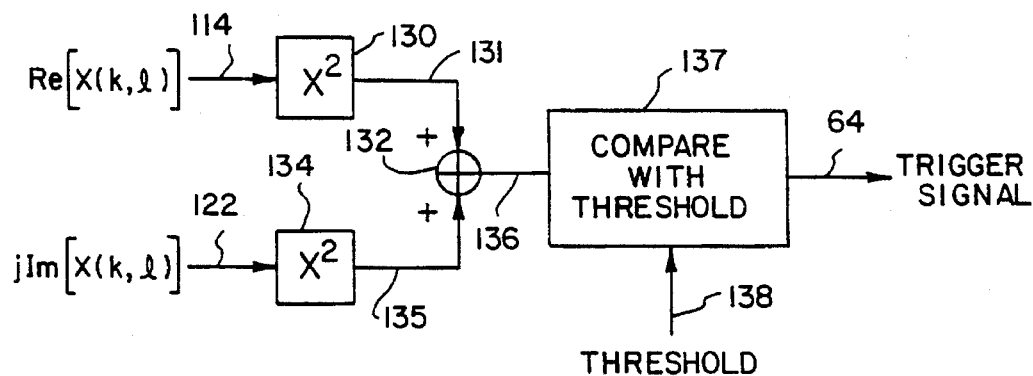
FIGS. 6–8 are block diagrams illustrating exemplary triggering determinations based on frequency component magnitudes.

Turning to FIG. 6, an exemplary use of the frequency component information provided at the frequency index k from FIG. 5 to provide a trigger signal is shown. In this implementation, the value of the real part of X(k,l) on the path 114 is provided to a squaring function 130 which provides the square value on the path 131 to a summing junction 132. Similarly, the imaginary part of X(k,l) in the path 122 is provided to a squaring function 134 with the squared output provided on a path 135 to the summing junction 132. The output of the summing junction 132 on a path 136 is the sum of the squares of the real and imaginary parts of X(k,l), or the square of the magnitude of X(k,l). This squared magnitude is compared in a comparator function 136 with a threshold value provided on a data path 138 to the comparator 137. Depending on the mode selected, if the value of the magnitude squared, on the path 136, is greater than, or less than, the value of the threshold on the path 138, a trigger signal is provided on the output line 64 to the waveform memory to cause it to save the data then in memory. Of course, the threshold value on the line 38 is the square of the desired magnitude threshold.

Figure 7:
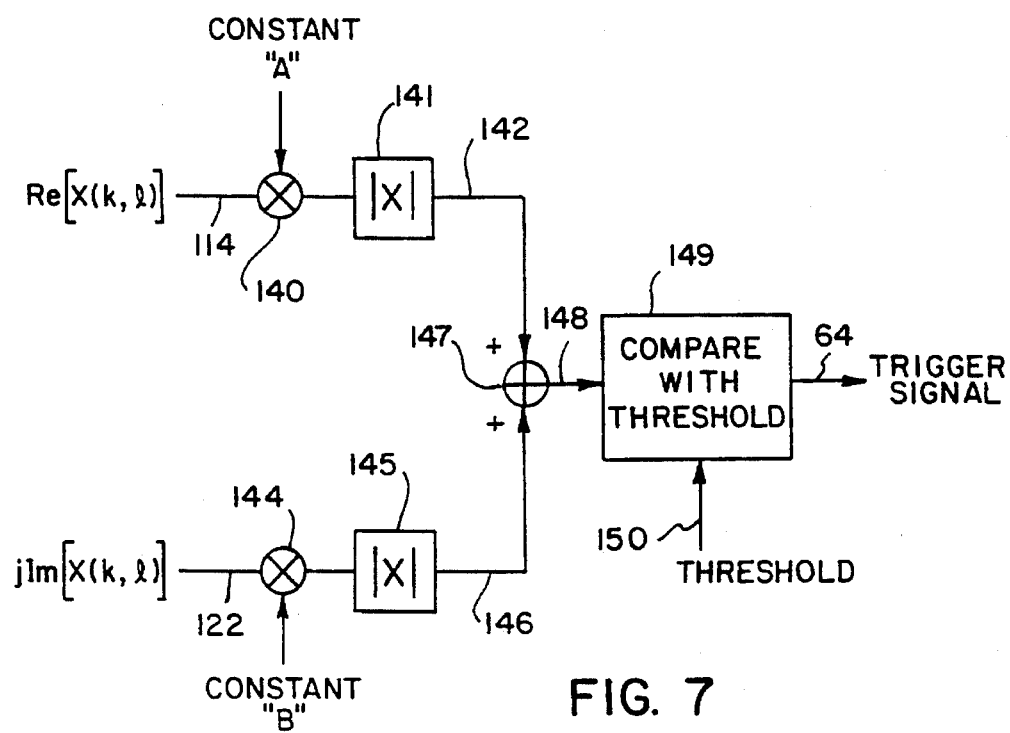

An alternative embodiment is shown in FIG. 7 in which the real part of X(k,l) on the path 114 is provided to a multiplying junction 140 which receives a constant value A as the other term for multiplication and provides its output to an absolute value function 141. The output of the absolute value function 141 on a path 142 is the scaled absolute value of the real part of X. Similarly, the imaginary part of X(k,l) is provided on the path 122 to a multiplying junction 144 which also recevies a constant B, the output of which is provided to an absolute value function 145 which provides its output on a path 146. The output of the function 145 is the scaled absolute value of the imaginary part of X(k,l). The values on the paths 142 and 146 are provided to a summing junction 147, the output of which on a path 148 is approximately equal to the effective magnitude of X(k,l). The values of the constants A and B are chosen to provide a good approximation to the actual magnitude. For example, where the constant A is provided to the multiplier 140 or 144 which receives the larger value at its other input, one useful value for A is 0.948059449. One useful value for B, which is then provided to the other multiplier 140 or 144, is 0.3926990817. The magnitude value on the line 148 is provided to a comparator 149 which receives a threshold value on a path 150 and provides a trigger signal on the line 64 if the magnitude value on the path 148 is greater than, or less than, the threshold value.

Figure 8:
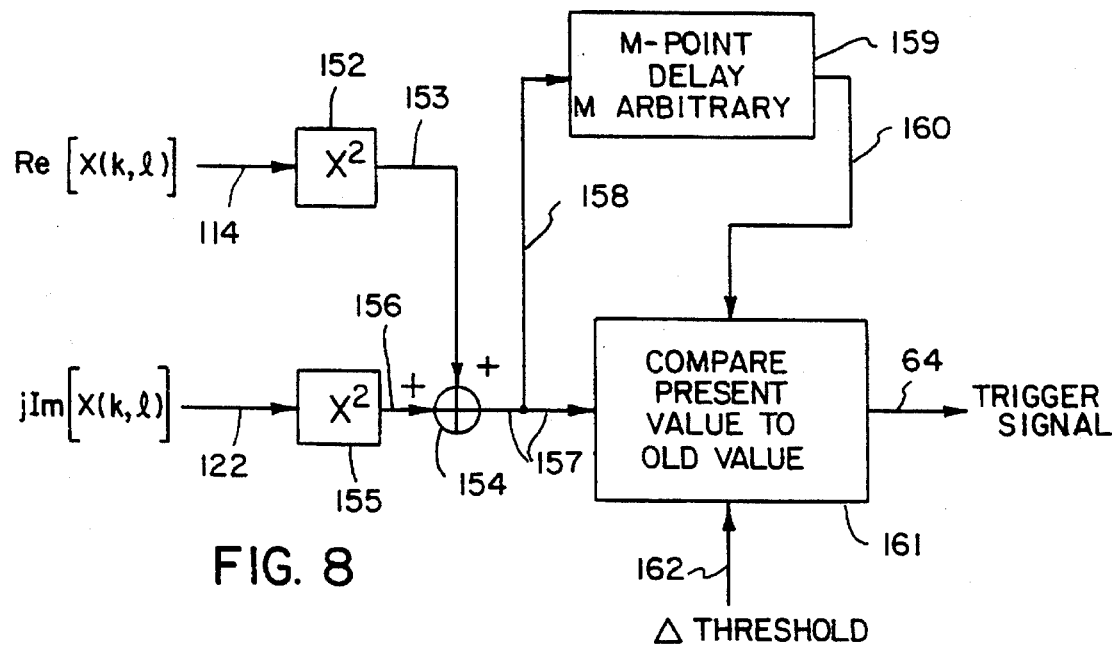

Triggering modes other than comparison of the value of the magnitude of a particular frequency component to a threshold may also be used. An example of a differential triggering criterion is shown in FIG. 8. In this example, the real part of X(k,l) on the path 114 is provided to a squarer 152 which provides a squared output on a line 153 to a summing junction 154. The imaginary part of X(k,l) on the path 122 is provided to a squarer 155 which provides its output on a path 156 to the summing junction 154. The output from the summing junction 154 on a path 157 is the sum of the squares of the real and imaginary parts. This value is provided on a path 158 to an M point delay unit 159 which provides its output on a path 160 to a comparator 161. The comparator 161 compares the value of the M point delayed sum of squares on the path 160 with the present value of the sum of the squares on the path 157. A trigger signal is then provided by the comparator 161 based on a selected criterion for the difference between the values on the paths 157 and 160. This difference corresponds to the rate of change of the magnitude of the selected frequency component. For example, a trigger signal may be provided when the difference goes negative, or when the difference exceeds a selected value indicative of a signal in which the frequency content at the frequency component k is changing sufficiently rapidly. The differential threshold value may be provided to the comparator 161 through a path 162 and may be selected by the user.

Figure 9:
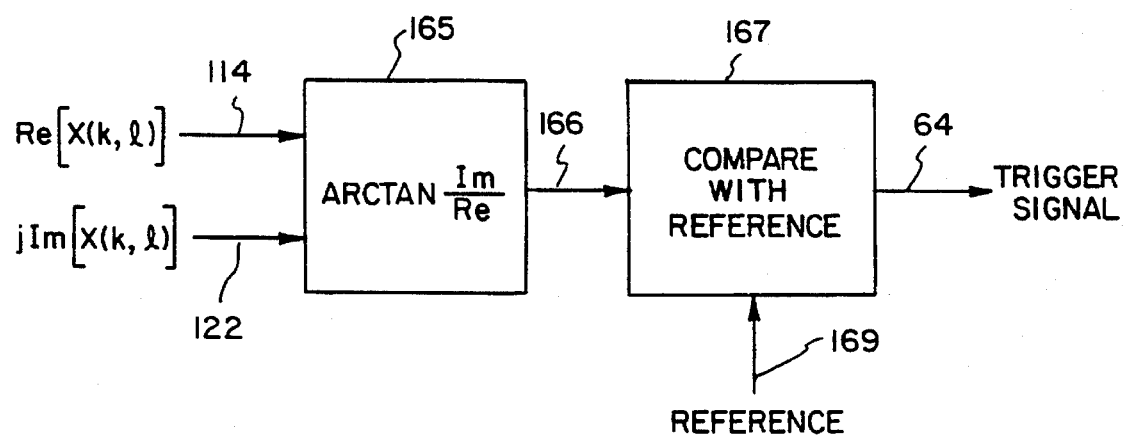
FIGS. 9–10 are block diagrams illustrating exemplary triggering determinations based on frequency component phases.

A further option for triggering is illustrated in FIG. 9 in which the real part on the path 114 and the imaginary part on the path 122 are provided to an arc tangent function 165 which determines the arc tangent of the imaginary part divided by the real part and provides this value on an output path 166 to a comparator 167. The comparator 167 compares the value in the path 166 with a reference on a path 169 and provides a trigger signal on the line 64 when the value exceeds, or alternatively, is less than, the reference on the path 169. This comparison thus provides phase based triggering, since the value on the path 166 represents the phase of the frequency component at the frequency bin k. The arc tangent function values are preferably stored in a ROM look-up table rather than being calculated minimize computation time.

Figure 10:
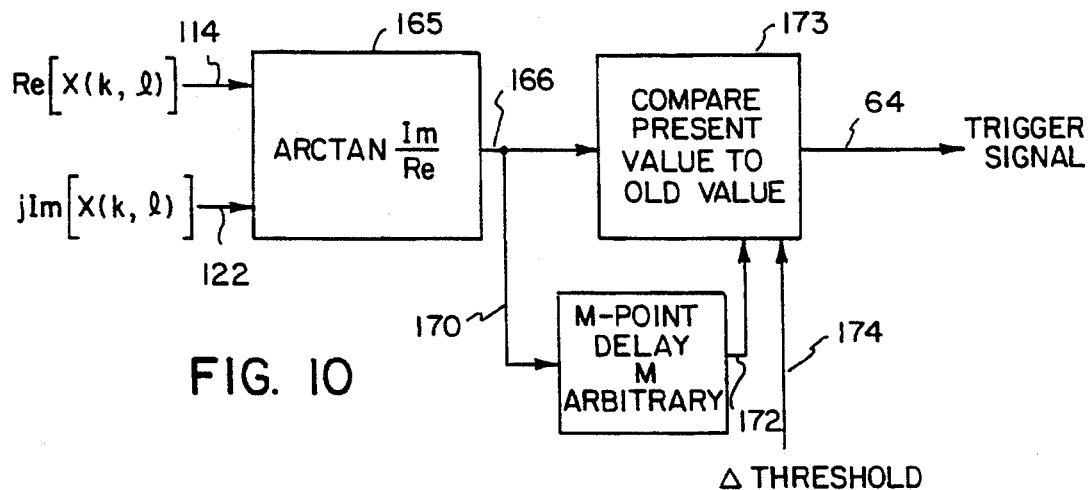

A variation of such triggering is shown in FIG. 10 wherein the arc tangent, on the path 166, is provided on a path 170 to an M point delay unit 171, the output of which is provided on a path 172 to a comparator 173. The comparator receives the M point delayed value of the phase on the path 172, compares it with the present value of the phase in the path 166, and provides a trigger signal on the line 64 if the difference is positive, or, alternatively, negative, or the differential may be compared with a differential threshold provided on a path 174 so that triggering only takes place if the difference exceeds the threshold. The difference corresponds to the rate of change of phase of the selected frequency component.

Other options are available for triggering. Two or more frequency bins may be used to make the decision as to triggering. For example, triggering may occur if a comparator for either of two bins exceed selected levels for the bins, or only if both exceed the selected levels. Exemplary flow diagrams are shown in FIGS. 11–17 to illustrate the various options available.

Figure 11:
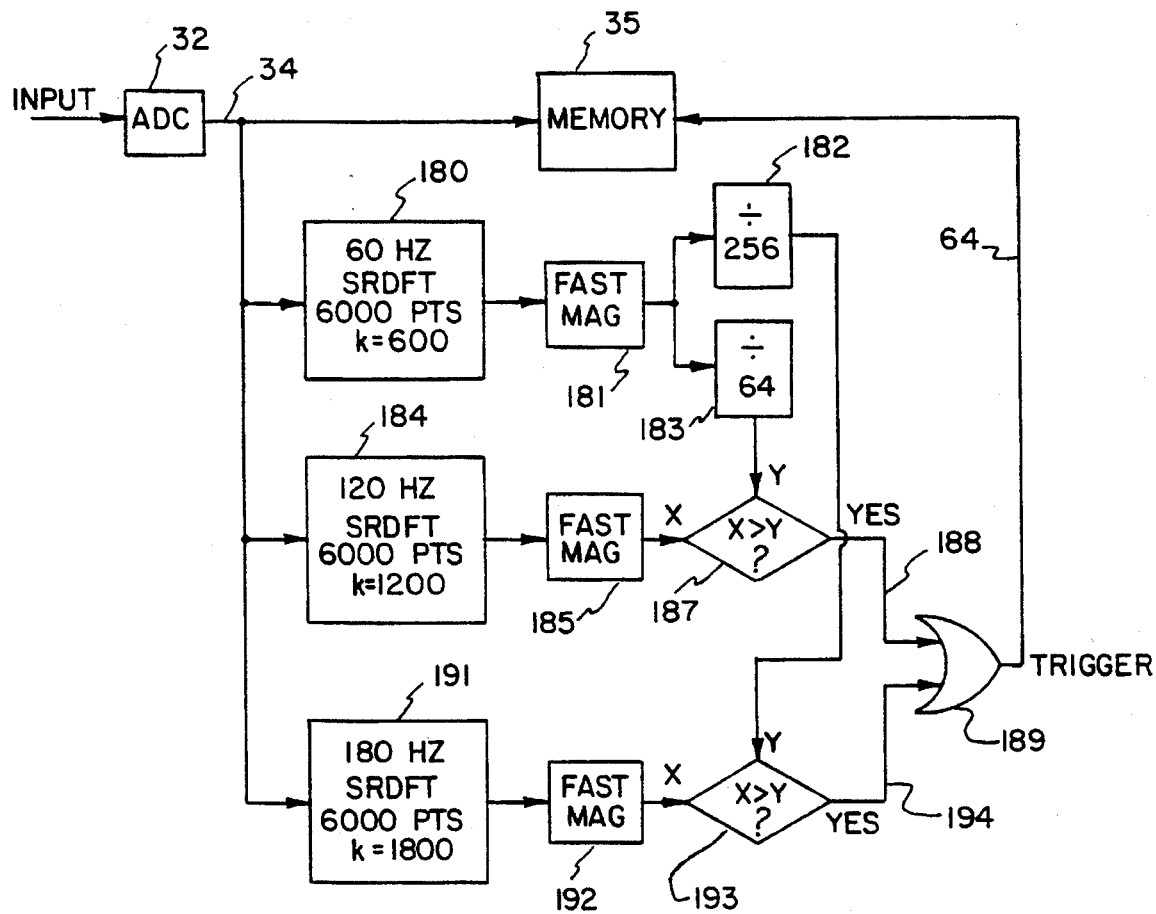
FIGS. 11–16 are block diagrams illustrating exemplary triggering determinations using several frequency components.

Referring to FIG. 11, a trigger is provided if the magnitude of the 120 Hz component is greater than 1.5625% of the 60 Hz magnitude bin, or if the 180 Hz magnitude bin is greater than 0.390625% of the 60 Hz magnitude bin. An SRDFT is performed at 180 on the 60 Hz component, and the fast magnitude of this is calculated at 181 (see, e.g., the implementations of the magnitude calculations in FIGS. 6 and 7), and are provided to dividers 182 and 183. The 120 Hz SRDFT is calculated at 184 and provided to a fast magnitude calculator 185 which provides its output to a comparator 187. If the value of the output of the magnitude computation 185 is greater than the divided magnitude from the divider 183, the comparator 187 provides an output signal on the path 188 to an OR function 189 which indicates that a trigger should be provided on the line 64. A 180 Hz SRDFT is performed at 191 on the data, a fast magnitude of this SRDFT is calculated at 192, and the output is provided to a comparator 193 which also receives the output of the divider 182. If the output of the fast magnitude calculation 192 is greater than the output of the divider 182, a trigger signal is provided on a line 194 through the OR function 189 so that a trigger signal is provided on the line 64.

As an alternative to the implementation provided in FIG. 11, to preserve relative bandwidth, the number of points in the SRDFT 184 may be 3,000 rather than 6,000, and in the SRDFT 191, 2,000 rather than 6,000.

Figure 12:
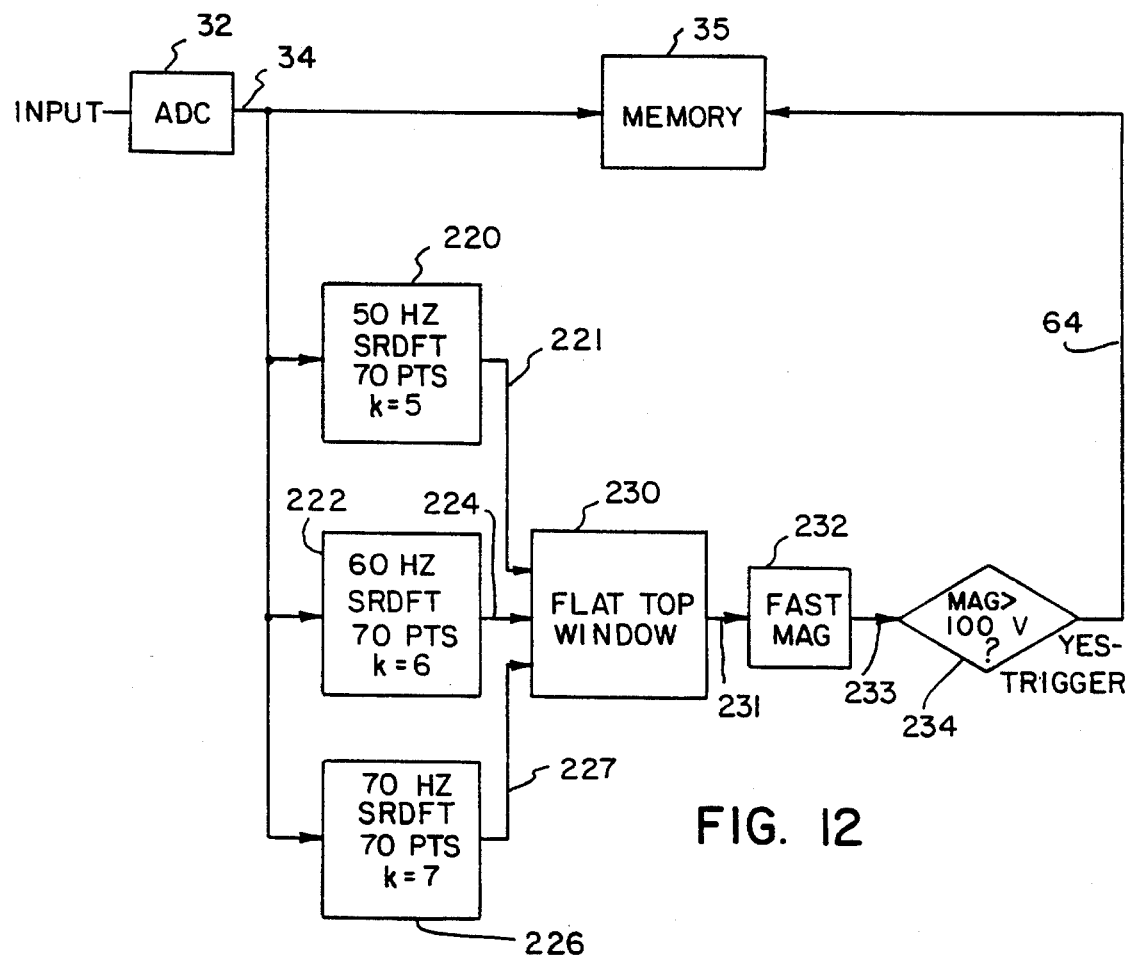

FIG. 12 illustrates an implementation in which a trigger is provided if the amplitude in a band from 50 Hz to 70 Hz exceeds 100 V. The center of the band is 60 Hz. 50 Hz, 60 Hz and 70 Hz are consecutive harmonics of 10 Hz. Assuming, for example, ten samples per cycle minimum at 70 Hz, a sampling rate of 700 Hz is obtained. 10 Hz bin spacing yields 0.1 second sample duration, or 70 points. As shown in FIG. 12, the digital data on the line 34 is provided to the 50 Hz SRDFT unit 220 which provides its output on a path 221, the 60 Hz unit 222 provides its output on a path 224, and the 70 Hz SRDFT unit 226 provides its output on a path 227. The values on the paths 221, 224 and 227 are provided to a flattop window function 230, as described above, which provides its output signal on a path 231. A fast magnitude computation is carried out on the data on the path 231 by a function 232, and the output of this function on a line 233 is provided to a comparator 234. The comparator 234 compares the value of the magnitude with, e.g., 100 volts. If this value is exceeded, a trigger signal is provided on the line 64; otherwise, no trigger occurs.

Figure 13:
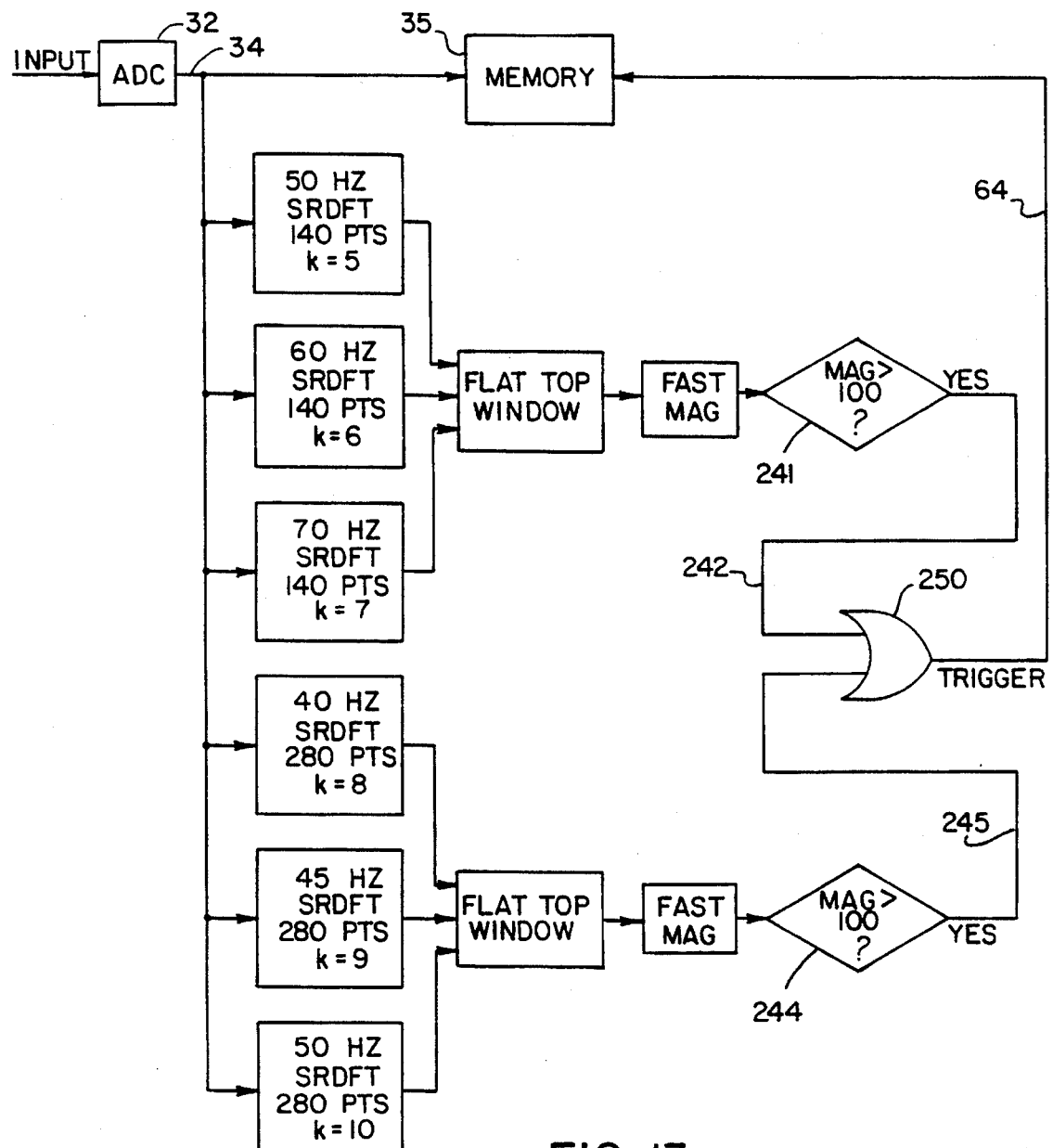

FIG. 13 illustrates providing a trigger if the amplitude in a band from 40 Hz to 70 Hz exceeds 100 volts. 40 Hz and 70 Hz are not alternate harmonics. These bands can be broken up into two bands, from 50 Hz to 70 Hz (as described previously) and from 40 Hz to 50 Hz. 40 Hz, 45 Hz, and 50 Hz are consecutive harmonics of 5 Hz. Assuming, for example, ten samples per cycle minimum at 50 Hz yields a sampling rate of 500 Hz. The analog-to-digital converter 32 must sample at least common multiples of 70 Hz and 50 Hz, which is greater than 700 Hz, to satisfy 10 points per cycle minimum at all frequencies. The next minimum value for the sampling rate is 1400 Hz. A 10 Hz bin spacing from 50 Hz to 70 Hz yields 0.1 second duration, or 140 points. 5 Hz bin spacing from 40 Hz to 50 Hz yields 0.2 second duration, or 280 points. The outputs of the 3 SRDFTs for 50 Hz, 60 Hz and 70 Hz are provided through a flattop window in a fast magnitude calculation to a comparator 241 which compares the magnitude with 100 volts. If the magnitude exceeds 100 volts, a yes triggering signal is provided on a output path 242 to an OR function 250. Similarly, the outputs of the 40 Hz, 45 Hz and 50 Hz SRDFT units are provided to a flattop window function and thereafter to a fast magnitude calculation and then to a comparator 244 which compares the magnitude so calculated with 100 volts. If the magnitude exceeds 100 volts, a yes trigger is provided on a path 245 to the OR function 250. Thus, a trigger signal will be provided on the line 64 to the memory if the magnitude of the frequencies from 50 Hz to 70 Hz exceed 100 volts or the magnitude of the frequencies from 40 Hz to 50 Hz exceed 100 volts.

Figure 14:
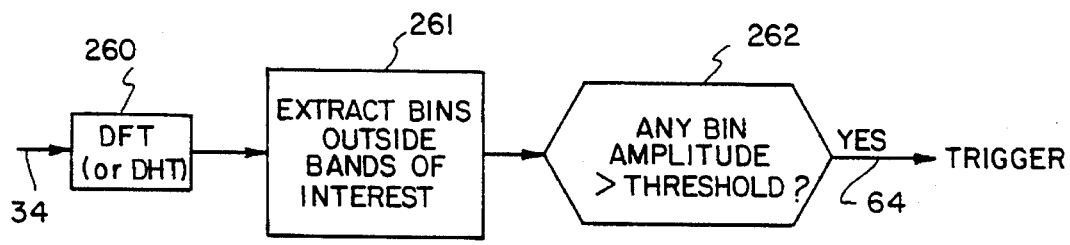
Figure 15:
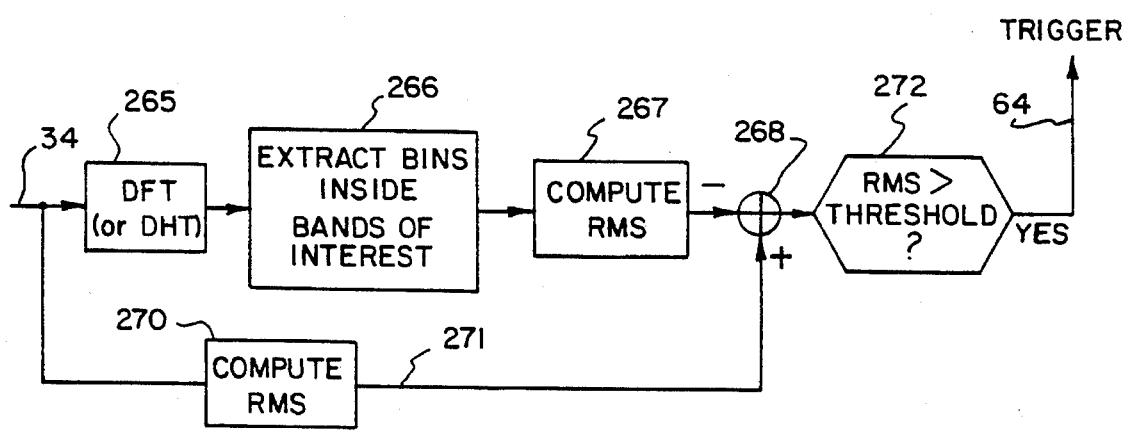
Figure 16:
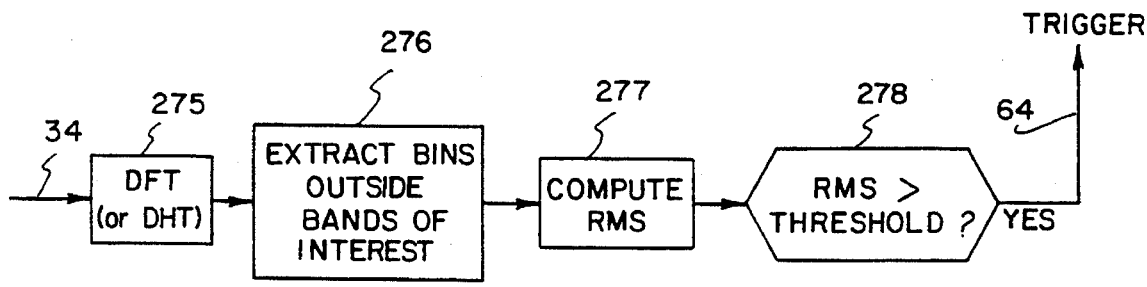

FIGS. 14–16 illustrate that the frequency triggering can be done to monitor signals outside selected bands so as to trigger the storage (or retention) of digital data in the memory if signals in such bands appear. For example, with reference to FIG. 14, the digital data on the line 34 is provided to a DFT function 260, which provides its output to a function 261 which extracts the bins outside the bands of interest. Comparison is then made at 262 to determine if any bin amplitude is greater than a selected threshold. If the answer is yes, a trigger is provided on the line 64. In the system illustrated in FIG. 15, the digital data is provided to a DFT unit 265 which provides its output to a unit 266 which extracts bins inside the bands of interest and then computes the RMS value of these at 267 and provides its output as the negative input to a summing junction 268. The digital data on the line 34 is also provided to an RMS calculation unit 270 which provides its output on a line 271 to the positive input of the summing junction 268. The output of the summing junction 268 is provided to a comparator 272 which determines whether the RMS differential value is greater than a selected threshold. If yes, then a trigger signal is provided on the line 64. In FIG. 16, the digital data is provided to a DFT unit 275 which provides its output to a function 276 which extracts bins outside the bands of interest. The RMS value of the ouput is computed at a function 277, and this calculated RMS value is compared at a comparator 278 to a threshold. A trigger signal is provided on the line 64 if the calculated RMS value exceeds the threshold.

Combining SRDFT techniques with phase locked loop techniques allows changes in the magnitude of a frequency component to be distinguished from a drifting of the nominal frequency. For example, if a trigger is to be provided for a reduction in magnitude of the $f_o$ frequency component using only SRDFT techniques, and the frequency of that component drifts to $f_1$ but the magnitude does not change, a trigger will be provided because the system will continue to monitor $f_0$, which will have zero magnitude. However, using a phase locked loop and SRDFT techniques, as the frequency of the component drifts from $f_0$ to $f_1$ the frequency being monitored also changes to $f_1$, so that only a true reduction in magnitude of the component will cause the trigger to be provided.

It is understood that the invention is not confined to the particular embodiments set forth herein as illustrative, but embraces such modified forms thereof as come within the scope of the following claims.

What is claimed is:

1. A method of acquiring and retaining data corresponding to a signal comprising the steps of:
   (a) acquiring digital data samples corresponding to a waveform of an input signal;
   (b) updating a discrete transform of a selected frequency component with respect to a set comprising a selected number of the digital data samples as a new digital data sample is acquired;
   (c) providing a trigger signal when a selected criterion for the frequency component is met by evaluating the updated frequency component and comparing the evaluated component with the selected criterion; and
   (d) writing digital waveform data corresponding to the acquired digital data samples in a memory and saving the data in the memory when the trigger signal is provided.

2. The method of claim 1 including the additional step of displaying the waveform data saved in the memory on a display device as a function of time.

3. The method of claim 1 wherein the discrete transform is selected from the group consisting of a discrete Fourier transform, a discrete Hartley transform, a sliding discrete Fourier transform, a sliding discrete Hartley transform, a chirp Z transform, a synchronized recursive discrete Fourier transform and a synchronized recursive discrete Hartley transform.

4. The method of claim 1 wherein a selected frequency component has a magnitude and the selected criterion is a level for the magnitude of the selected frequency component and the trigger signal is provided when the level is exceeded.

5. The method of claim 1 wherein a selected frequency component has a phase and the selected criterion is a value for the phase of the selected frequency component and the trigger signal is provided when the phase value is exceeded.

6. The method of claim 1 wherein a selected frequency component has a rate of change of magnitude over time and the selected criterion is a chosen value for the rate of change of magnitude over time of the selected frequency component and wherein the trigger signal is provided when the rate of change exceeds the chosen rate of change.

7. The method of claim 1 wherein a selected frequency component has a rate of change of phase over time and the selected criterion is a chosen rate of change of phase over time of the selected frequency component and wherein the trigger signal is provided when the rate of change exceeds the chosen rate of change.

8. The method of claim 1 wherein a plurality of selected frequency components are updated as a new data sample is acquired, a frequency band of interest having a center and end points, the selected frequency components spanning the frequency band of interest and located at the center and end points of the frequency band of interest, and wherein the frequency components are adjacent consecutive harmonics of a fundamental frequency, and wherein the step of providing the trigger signal combines magnitudes of the selected frequency components using a window function to provide a result of the combination and compares the result of the combination with a chosen threshold value and provides the trigger signal when the result exceeds the value.

9. The method of claim 1 wherein the step of updating the discrete transform is carried out in accordance with the expression:

$$X(k, l) = X(k, l-1) + e^{\frac{-j2\pi k(l-1)}{N}} * [x(l+N-1) - x(l-1)]$$

where k is a frequency bin index for the selected frequency component, the number of sample points in the discrete transform is N, x(n) is a magnitude of time domain data at a sample "n" where n is a time domain index, l is a time index at which the number N of points in the discrete transform begins, wherein the index l is measured from a chosen zero time point, and X(k, l) is a complex amplitude in the frequency bin k which is the discrete transform for the selected frequency component with respect to the index l.

10. The method of claim 1 wherein a plurality of selected frequency components are updated as a new data sample is acquired, and wherein the step of providing the trigger signal combines characteristics of the selected frequency components and the trigger signal is provided when the characteristics so combined meet the selected criterion.

11. The method of claim 10 wherein the characteristics of the frequency components are magnitudes of the components.

12. The method of claim 11 wherein the trigger signal is provided when any one of the magnitudes of the frequency components exceeds a chosen value.

13. The method of claim 11 wherein the trigger signal is provided when the magnitude of one selected frequency component exceeds a chosen percentage of the magnitude of another selected frequency component.

14. The method of claim 10 wherein the characteristics of the frequency components are phases of the frequency components.

15. The method of claim 1 wherein the memory is a circular memory and, in the step of writing, new waveform data is continuously rewritten over old waveform data in the memory until the trigger signal is provided and the writing of new data is stopped.

16. A method of acquiring and retaining data corresponding to a signal, comprising the steps of:
   (a) acquiring digital data samples corresponding to a waveform of an input signal;
   (b) updating a discrete Fourier transform of a frequency component of the digital data as a new digital data sample is acquired in accordance with the expression:

$$X(K, l) = X(k, l-1) + e^{\frac{-j2\pi k(l-1)}{N}} * [X(l+N-1) - x(l-1)]$$

where k is a frequency bin index for the frequency component, the number of sample points in the discrete Fourier transform is N, x(n) is a magnitude of time domain data at a sample "n" where n is a time domain index, l is a time index at which the number N of points in the discrete Fourier transform begins, wherein the index l is measured from a chosen zero time point, and X(k, l) is a complex amplitude in the frequency bin k which is the discrete Fourier transform for the frequency component with respect to the index l;
   (c) providing a trigger signal when a selected criterion for the frequency component is met by evaluating the updated frequency component and comparing the evaluated component with the selected criterion; and
   (d) writing digital waveform data corresponding to the acquired digital data samples in a memory and saving the data in the memory when the trigger signal is provided.

17. The method of claim 16 wherein a selected frequency component has a magnitude and the selected criterion is a level for the magnitude of the selected frequency component and the trigger signal is provided when the level is exceeded.

18. The method of claim 16 wherein a selected frequency component has a phase and the selected criterion is a value for the phase of the selected frequency component and the trigger signal is provided when the phase value is exceeded.

19. The method of claim 16 wherein a selected frequency component has a rate of change of magnitude over time and the selected criterion is a chosen rate of change of magnitude over time of the frequency component and wherein the trigger signal is provided when the rate of change exceeds the chosen rate of change.

20. The method of claim 16 wherein a selected frequency component has a rate of change of phase over time and the selected criterion is a chosen rate of change of phase over time of the frequency component and wherein the trigger signal is provided when the rate of change exceeds the chosen rate of change.

21. The method of claim 16 wherein a plurality of selected frequency components are updated as a new data sample is acquired, a frequency band of interest having a center and end points, the selected frequency components spanning the frequency band of interest and located at the center and end points of the frequency band of interest, and wherein the frequency components are adjacent consecutive harmonics of a fundamental frequency, and wherein the step of providing the trigger signal combines magnitudes of the selected frequency components using a window function to provide a result of the combination and compares the result of the combination with a chosen threshold value and provides the trigger signal when the result exceeds the value.

22. The method of claim 16 wherein a plurality of selected frequency components are updated as a new data sample is acquired, and wherein the step of providing the trigger signal combines characteristics of the selected frequency components and the trigger signal is provided when the characteristics so combined meet the selected criterion.

23. The method of claim 22 wherein the characteristics of the frequency components are magnitudes of each of the components.

24. The method of claim 22 wherein the characteristics of the frequency components are phases of the frequency components.

25. A data acquisition and display apparatus comprising:
   (a) a memory for storing digital data;
   (b) an analog-to-digital converter sampling means for sampling a time varying input signal to produce digital data corresponding to a waveform of the signal;
   (c) display means for receiving digital data to provide a visual display corresponding to the received data on a display screen;
   (d) processor means connected to the analog-to-digital converter sampling means, to the memory, and to the display means, for controlling the writing into the memory of input signal digital data from the sampling means such that when a trigger signal is provided the processor means controls the memory to save the waveform data in the memory, and wherein the processor means includes means for updating a discrete transform with respect to a set comprising a selected number of data points of the digital data samples for at least one frequency component as a new digital data sample is acquired, and means for providing the trigger signal when a selected criterion for the frequency component is met by evaluating the updated frequency component and comparing the evaluated component with the selected criterion, and further for controlling the reading of the data in the waveform memory to display the data on the display screen of the display means as a function of time.

26. The apparatus of claim 25 wherein the memory is a circular memory and new data is rewritten over old data until the trigger signal is provided and the processor means stops the writing of new data into the memory.

27. The apparatus of claim 25 wherein the processor means performs a discrete transform selected from the group consisting of a discrete Fourier transform, a discrete Hartley transform, a sliding discrete Fourier transform, a sliding discrete Hartley transform, a chirp Z transform, a synchronized recursive discrete Fourier transform and a synchronized recursive discrete Hartley transform.

28. The apparatus of claim 25 wherein the processor means updates the discrete transform to provide a magnitude for a selected frequency component and the selected criterion is a level for the magnitude of the selected frequency component and the trigger signal is provided when the level is exceeded.

29. The apparatus of claim 25 wherein the processor means updates the discrete transform to provide a phase for a selected frequency component and the selected criterion is a value for the phase of the selected frequency component and the trigger signal is provided when the phase value is exceeded.

30. The apparatus of claim 25 wherein the processor means updates the discrete transform to provide a rate of change of magnitude over time of a selected frequency component and the selected criterion is a chosen value for the rate of change of magnitude over time of the selected frequency component and wherein the trigger signal is provided when the rate of change exceeds the chosen rate of change.

31. The apparatus of claim 25 wherein the processor means updates the discrete transform to provide a rate of change of phase over time of a selected frequency component and the selected criterion is a chosen rate of change of phase over time of the selected frequency component and wherein the trigger signal is provided when the rate of change exceeds the chosen rate of change.

32. The apparatus of claim 25 wherein the processor means updates a plurality of selected frequency components as a new data sample is acquired, the selected frequency components spanning a frequency band of interest which has a center and end points and the selected frequency components located at the center and end points of the frequency band of interest, and wherein the frequency components are adjacent consecutive harmonics of a fundamental frequency, and wherein the processor means provides the trigger signal by combining magnitudes of the selected frequency components using a window function to provide a result of the combination and comparing the result of the combination with a chosen threshold value and providing the trigger signal when the result exceeds the value.

33. The apparatus of claim 25 wherein the processor means updates the discrete transform in accordance with the expression:

$$X(k, l) = X(k, l-1) + e^{\frac{-j2\pi k(l-1)}{N}} * [X(l+N-1) - x(l-1)]$$

where k is a frequency bin index for the selected frequency component, the number of sample points in the discrete transform is N, x(n) is a magnitude of time domain data at a sample "n" where n is a time domain index, l is a time index at which the number N of points in the discrete transform begins, wherein the index l is measured from a chosen zero time point, and X(k, l) is a complex amplitude in the frequency bin k which is the discrete transform for the selected frequency component with respect to the index l.

34. The apparatus of claim 25 wherein the processor means updates a plurality of selected frequency components with every new data sample and provides the trigger signal by combining characteristics of the selected frequency components and providing the trigger signal when the characteristics so combined meet the selected criterion.

35. The apparatus of claim 34 wherein the characteristics of the frequency components are magnitudes of the components.

36. The apparatus of claim 34 wherein the characteristics of the frequency components are phases of the components.

37. A method of acquiring and retaining data corresponding to a signal, comprising the steps of:

(a) acquiring digital data samples corresponding to a waveform of an input signal;

(b) updating a discrete transform of a plurality of selected frequency components with respect to a set comprising a selected number of the digital data samples as a new digital data sample is acquired, the selected frequency components spanning a frequency band of interest which contains plural adjacent frequency subbands, the subbands of the frequency band of interest each having a center and end points, the frequency components being selected so that three frequency components span each subband and are located at the center and end points of the subband, and wherein the frequency components spanning each subband are adjacent consecutive harmonics of a fundamental frequency;

(c) writing digital data corresponding to the acquired data samples in a memory and saving the data in the memory when a trigger signal is provided; and (d) providing the trigger signal by combining magnitudes of the selected frequency components spanning each subband using a window function to provide a result of the combination and providing the trigger signal when the result of the combination meets a selected criterion.

38. The method of claim 37 wherein the selected criterion is a chosen threshold value and the trigger signal is provided when the result for any frequency subband exceeds the value.

\* \* \* \* \*